United States Patent [19]
Hartmann

[11] 3,943,527
[45] Mar. 9, 1976

[54] NONCONTACTING MARKER

[75] Inventor: John Charles Hartmann, Cedar Grove, N.J.

[73] Assignee: RCA Corporation, New York, N.Y.

[22] Filed: June 4, 1975

[21] Appl. No.: 583,603

[52] U.S. Cl. ............ 346/33 F; 346/75; 346/140 R; 222/108; 141/119; 141/258; 118/8; 118/50; 118/410
[51] Int. Cl.². G01D 9/00; G01D 15/18; B67D 1/16
[58] Field of Search ................... 346/33 F, 75, 140; 222/108, 571; 324/158; 141/119, 258; 118/8, 50, 410

[56] References Cited
UNITED STATES PATENTS

| | | | |
|---|---|---|---|
| 2,766,484 | 10/1956 | Sanderson ...................... | 118/50 UX |
| 3,345,567 | 10/1967 | Turner et al. ................ | 346/33 F UX |
| 3,614,940 | 10/1971 | Abrams et al. ................ | 346/140 UX |
| 3,884,183 | 5/1975 | Sprung, Jr. ........................... | 118/324 |
| 3,895,748 | 7/1975 | Klingenberg ........................ | 222/571 |
| 3,900,866 | 8/1975 | Bell et al. ........................ | 346/140 X |

FOREIGN PATENTS OR APPLICATIONS 554,308   6/1943   United Kingdom ................ 346/140

Primary Examiner—George H. Miller, Jr.
Attorney, Agent, or Firm—Raymond E. Smiley; Edward J. Norton

[57] ABSTRACT

A noncontacting marking apparatus for ejecting, upon receipt of a control signal, a drop of marking liquid for marking purposes. The amount of marking liquid is controllable. A tube couples the ejection point of the marker to a source of vacuum for removing excess liquid.

5 Claims, 3 Drawing Figures

NONCONTACTING MARKER

BACKGROUND OF THE INVENTION

There is a need for marking devices to mark small objects for later identification. For example, in the manufacture of integrated circuit chip wafers, there is a need to mark "bad" chips before the wafer is diced to provide individual chips. Heretofore, the marking has been done with a fibrous wick which must contact the bad chip to make a mark and concurrently may contact one or more surrounding chips, damaging them in the process. Further, so-called bad chips may, in fact, be less than perfect, but not totally defective. Contact by the marking wick may damage such chips so that they become useless.

Therefore, desireably a noncontacting marker should be utilized. Ink spritzers are known for ejecting a drop of ink upon mechanical constriction of a part of the spritzer. Unfortunately, however, these devices do not eject a large enough drop of liquid to visually identify, for example, a bad integrated circuit. Other devices are known, which can eject a larger quantity of liquid, but the amount ejected and therefore the spot size created, are not satisfactorily controllable.

SUMMARY OF THE INVENTION

In the present invention, means including a connection to a source of marking liquid and including a nozzle is provided. A driven plunger moves in one direction to receive marking liquid into a chamber and then is driven in the opposite direction to eject the liquid. In a preferred embodiment, a tube extends between the ejection point of the nozzle and a source of vacuum for drawing any excess liquid from the nozzle to prevent any undesired marking of items.

DETAILED DESCRIPTION

Figure 1:
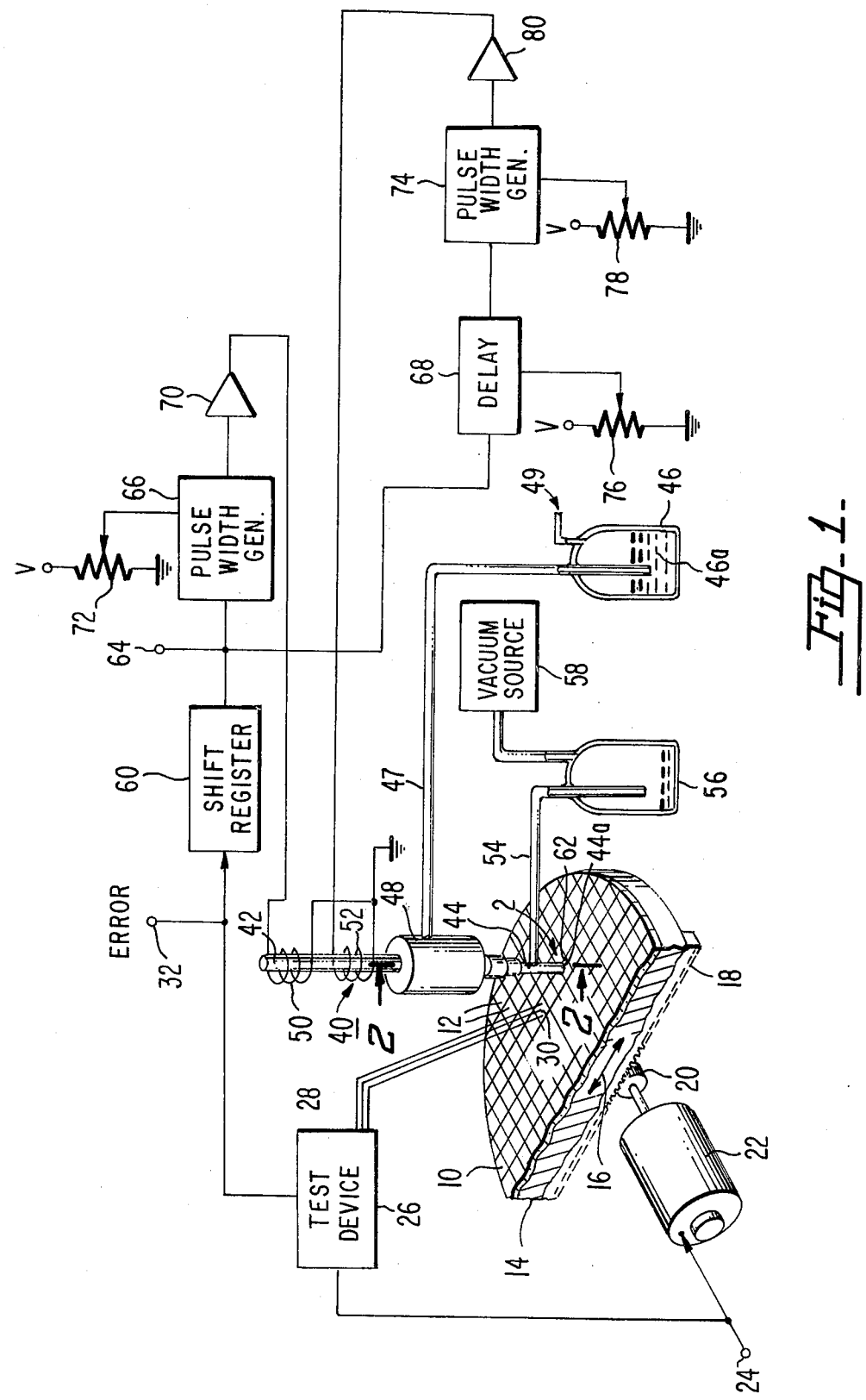
FIG. 1 is a generally mechanical schematic and electrical representation of an integrated circuit test set-up embodying the present invention.

Referring to FIG. 1, an integrated circuit (hereafter referred to as IC) wafer 10 contains a plurality of IC chips 12, arranged in a two dimensional row and column matrix. Wafer 10 is mounted in a carrier 14 for linear movement in the directions indicated by double ended arrow 16. This movement may be accomplished by any suitable means, a rack 18 and pinion 20 arrangement being schematically illustrated. Drive means 22 is arranged to rotate pinion 20 a fixed amount upon receipt of a control signal at terminal 24. A similar arrangement (not shown) can be utilized to drive wafer 10 in the normal direction to that indicated by arrow 16. A test device 26 of any conventionally available type is arranged in fixed relationship to drive means 22, and has a plurality of test probes 28 arranged to serially test an IC 12 presented at location 30. The results of the test are represented by a signal of one voltage level or another at terminal 32.

Operation of apparatus just described is as follows: Test device 26 tests an IC 12 at position 30; a signal representing the results of the test appears at terminal 32; a control signal is issued at terminal 24, causing drive means 22 to advance carrier 14 so that the next succeeding IC 12 is presented at location 30. Then the process repeats.

A marking unit 40 is positioned relative to wafer 10 such that it can mark IC's 12 determined to be defective by test device 26. (In practice, in the type of set-up shown, two marking units 40 must be provided, one on either side of test unit 26, so that one unit is effective to mark bad IC's when the carrier 14 is moving to the right, as illustrated in FIG. 1, and the other is effective when the carrier moves to the left.) Marking unit 40 will be described in more detail in connection with FIG. 2, but it consists principally of a plunger 42, a nozzle 44, and a container of marking liquid 46, all coupled to aperture block 48. Liquid 46a passes through tube 47 to the aperture block. An opening 49 in container 46 admits air to displace liquid 46a removed from the container. Liquid 46a may be any liquid suitable for the task to be performed. In the IC test set-up of FIG. 1, a slow drying ink was chosen to prevent any clogging of nozzle 44. Ejected ink is then baked on to chip 12 by an oven (not shown). A type of ink that has been found satisfactory for the marking assignment herein described is Graphic Controls Red 151.

Power driven units, such as solenoids 50 and 52, are disposed relative to plunger 42 so as to, when energized, respectively, raise plunger 42 to admit liquid 46a into aperture block 48, and lower plunger 42 so as to force the liquid from nozzle 44. A tube 54 extends from a point proximate the tip 44a of nozzle 44 to container 56. The container is also coupled to a vacuum source 58. This arrangement causes excess liquid which would otherwise build up on tip 44a to be drawn into container 56 rather than to undesirably fall onto an IC 12.

Returning to terminal 32, it is connected to a shift register 60, which stores signals received from test device 26 and shifts previously entered signals along as new signals are entered, indicating the quality of each IC 12. Shift register 60 contains enough stages to hold data for the number of IC's between test probes 28 and nozzle 44, in this example three. Therefore, terminal 64 coupled to shift registor 60 will be at a polarity indicative of whether the IC 12 at position 62 is good or bad. It should be noted that if marking unit 44 is made sufficiently small, then it is possible to place it immediately adjacent test probes 28. In this case, shift register 60 could be eliminated or, at most, be a single stage memory device.

Terminal 64 is in turn coupled to a voltage controlled pulse width generator 66 and to a voltage controlled delay 68. Pulse width generator 66 is responsive to a signal at terminal 64 indicative of a bad IC to produce at power amplifier 70 a pulse of desired polarity of a width which is controlled by potentiometer 72 coupled to generator 66. The output terminal of amplifier 70 is coupled to solenoid 50. Potentiometer 72, therefore, controls the length of time that solenoid 50 is energized. Delay 68 is responsive to a signal at terminal 64 indicative of a bad IC to provide a delayed pulse of desired polarity at the input terminal of pulse width generator 74, the delay time being determined by the setting of potentiometer 76, which is coupled to delay 68.

Pulse width generator 74, which may be identical to generator 66, is controlled by a potentiometer 78 coupled thereto and is in turn coupled via power amplifier 80 to solenoid 52. Therefore, potentiometer 76 controls how long after solenoid 50 is energized solenoid 52 is energized. Potentiometer 78 controls how long solenoid 52 is energized. Each of shift register 60, pulse width generators 66 and 74, delay 68, and power amplifiers 70 and 80 are commercially available products which need only have applied to them control potentiometers, as shown, and appropriate power (not shown) and therefore, need no further explanation.

Figure 2:
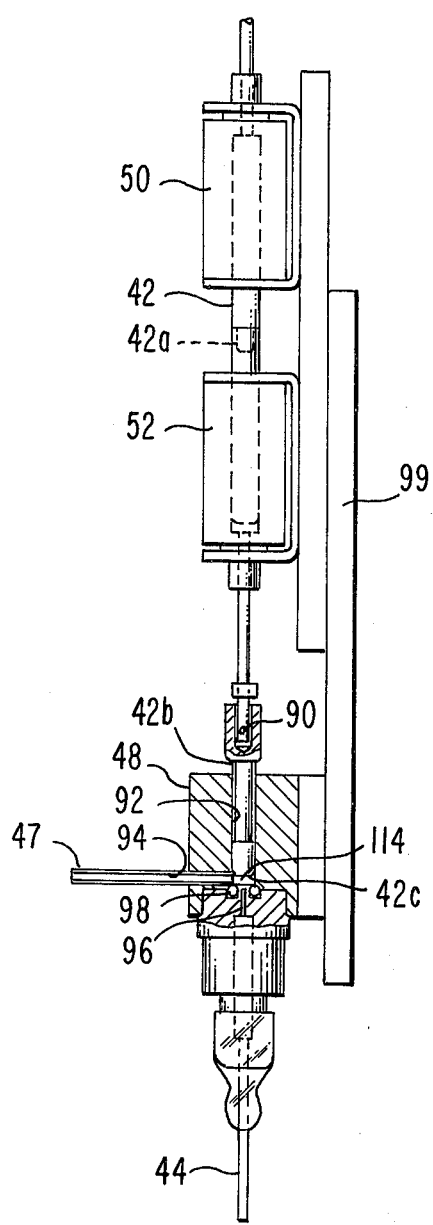
FIG. 2 is a cross section along lines 2—2 of FIG. 1 of a noncontacting marking unit according to the present invention.

Marking unit 40 is shown in detail in FIG. 2 to which attention is now directed. Plunger 42 is illustrated to comprise two parts, the portion 42a, which passes through solenoids 50 and 52, and the portion 42b, which enters aperture block 48. A pivotal connection is made at juncture 90 so that if solenoids 50 and 52 are not in perfect alignment with aperture block 48, no binding will occur with regard to plunger portion 42b.

Aperture block 48 contains three interconnected openings or apertures which are preferably cylindrical, the first 92 in which a portion of plunger 42b resides with a liquid tight fit, the second 94 permitting inflow of liquid through tube 47, and the third 96, to permit liquid ejection into nozzle 44. An O ring seal 98 surrounds aperture 96. When plunger 42 is fully seated, tip 42c forms a liquid tight seal with O ring 98 preventing any liquid from passing between tube 47 and ejection port 96.

Aperture block 48 is mechanically coupled via an adjustable linkage 99 to solenoids 50 and 52. Adjustment means are provided as needed so that plunger 42 will, upon command signals being received at the proper solenoid, move between the raised position shown in FIG. 2, a position just above aperture 94, to a position in which tip 42c of plunger 42 resides against O ring 98.

Figure 3:
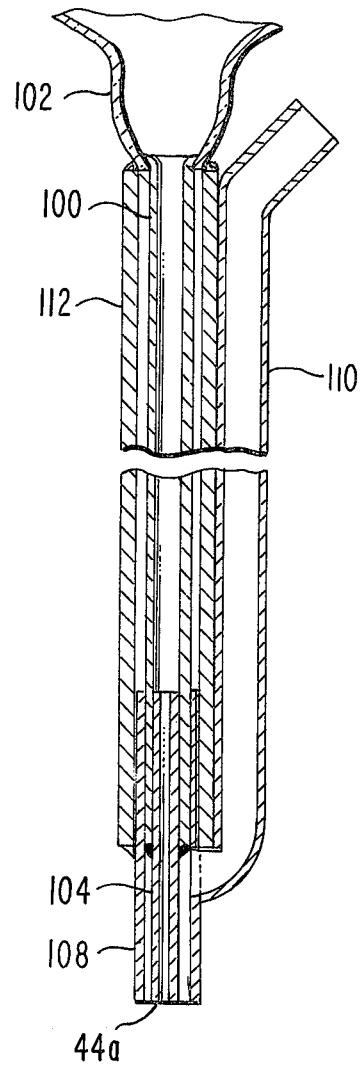
FIG. 3 is an enlarged cross section of the nozzle portion of the noncontacting marker of FIG. 2, also along lines 2—2 of FIG. 1.

Aperture block 48 is mechanically coupled to a modified hypodermic needle nozzle 44, which receives liquid exiting through aperture 96. Nozzle 44 is illustrated in cross-section in FIG. 3 to which attention is now directed. A standard hypodermic needle 100 has on one end an adapter 102 for coupling to aperture block 48 and has a smaller diameter tube 104 inserted in the other end to provide a relatively small exit tip diameter at 44a. In a practical embodiment for creating a 0.5 to 2.0 mm diameter spot, the inside diameter at tip 44a is chosen to be 0.15 mm in diameter. A second short length of tube 108 is secured to the outside of tube 100, thus providing a cylindrical opening between tubes 104 and 108. The free ends of tubes 104 and 108 desirably extend to the same longitudinal position.

An opening is bored into the side of tube 108, permitting interconnection between an additional tube 110 and the cylindrical area formed by tubes 104, 108. The free end of tube 110 is connected to return container 56 (FIG. 1), the arrangement causing excess droplets of liquid, which would otherwise form at tip 44a to be drawn into container 56. It has been found desirable in practice to include another tube 112 coextending with tube 100 and secured thereto at both ends for the purpose of providing mechanical stiffening.

In operation, it will be assumed that a sufficient amount of marking liquid 46a is present in container 46, that tube 47 is filled with liquid (in a working embodiment this was accomplished with the aid of capillary action as the liquid container was actually located below aperture block 48), that tube 100 (FIG. 3) is filled with marking liquid, and that plunger 42 is fully seated against O ring 98 (FIG. 2). When a signal is received at terminal 64 (FIG. 1) indicating a drop of liquid is to be ejected from marking unit 40, solenoid 50 is energized drawing plunger 42 upward (as illustrated in FIG. 2) to a position above aperture 94. The cavity or chamber 114 thus created will be at lower than atmospheric pressure since all apertures in aperture block 48 are blocked. Perhaps, some liquid flows in through aperture 96. However, since the opening at nozzle tip 44a is quite small, the amount of liquid, if any, which enters chamber 114 from that source is negligible. Liquid does, however, desirably enter through tube 47. The greater the length of time that plunger 42 remains elevated, the more liquid will enter the chamber (up to the capacity of the chamber). By adjusting the length of the drive pulse from pulse width generator 66 and the delay in delay 68 (which is always set to be longer than the drive pulse of generator 66), the elevation time of plunger 42 is regulated. It might, at first, seem that delay 68 could be eliminated and the pulse from generator 66 merely increased. It has been determined, however, that better control over the amount of liquid entering the chamber (and therefore discharged) is obtained with both elements 66 and 68 present.

After the desired amount of liquid has filled chamber 114 and delay 68 has time out, pulse width generator 74 is triggered to produce a drive pulse to energize solenoid 52 to drive plunger 42 toward aperture 96 and O ring 98, thus reducing the volume of chamber 114 substantially to zero. Some liquid, undoubtedly, undesirably re-enters tube 47 through aperture 94, but the desired quantity is driven through aperture 96 into nozzle 44, forcing a desired quantity of liquid through tip 44a and onto the IC to be marked. As subsequent drops of liquid are ejected from tip 44a while marking succeeding bad IC's, the droplets of ink which build up at the outside of tube 104 are driven into container 56. It has been found through experience that the amount of control exerted by the length of the drive pulse to solenoid 50 by means of potentiometer 72 is not as great as that exerted by adjustment of the pulse from generator 74. The potentiometer 72 does, however, have some effect on the amount of liquid ejected from tip 44a and therefore desirably forms part of the circuit.

It might at first seem that there is no need for both solenoid 50 and 52, and that some sort of spring bias could be substituted for one or the other of solenoids 50 and 52. However, if the spring replaces solenoid 50, then solenoid 52 would have to be energized almost all the time to keep liquid from undesirably dripping from the nozzle. Were the spring to replace solenoid 52, the kind of controllability needed to produce consistent size spots could not be attained. Likewise, the excess liquid removal system has been found to be necessary, since in its absence liquid droplets build up at tip 44a and then undesirably drop off, incorrectly marking an IC chip.

Depending on the nature of the marking assignment, one or more of circuits 66, 68 and 74 may have its parameters fixed as manufactured. However, the system illustrated in FIG. 1 provides the most flexibility. It should also be noted that the type of liquid chosen will also depend on the marking assignment. For example, a colorless magnetic fluid may be chosen so that the marked items may later be detected by automated equipment.

What is claimed is:

1. A liquid marking device comprising, in combination:

means containing first, second and third interconnected apertures, said first aperture being coupled to a source of marking liquid, said second aperture being adapted to receive a plunger means, said third aperture forming a nozzle;

a plunger residing in said second aperture forming a liquid receiving chamber therein, said plunger being movable between two positions, the first being such as to increase the volume of said chamber, the second being such as to reduce the volume of said chamber and to close the interconnection between said first and second apertures;

first power driven means coupled to said plunger for moving said plunger to said first position for receiving said marking liquid in said chamber; and second power driven means for moving said plunger to said second position for forcing said liquid to be ejected from said nozzle.

2. The combination of claim 1 further including electrical means coupled to said first and second power driven means for controlling the length of time said power is applied to said first power driven means and for controlling the time between energization of said first power driven means and the energization of said second power driven means to determine the volume of liquid taken into said chamber and thereafter ejected through said nozzle.

3. The combination of claim 1 further including a tube extending from a position proximate the ejecting end of said nozzle to a container at lowered atmospheric pressure relative to that at said nozzle end for drawing away from said nozzle excess liquid which is not ejected from said nozzle.

4. Non-contacting marking apparatus comprising in combination:

means including a chamber coupled to a source of marking liquid and containing an ejection nozzle;

power driven plunger means in said chamber movable between a first position in which liquid is moved into said chamber and a second position in which liquid is driven out of said nozzle to mark an item to be marked;

means extending between the exit point of said nozzle and a source of vaccum for drawing excess liquid from said nozzle, thereby preventing it from dropping onto said item.

5. Apparatus for marking an item for identification without contacting the item comprising in combination:

means responsive to a signal that an item to be marked is in marking relationship with said marking apparatus for producing a marking signal;

means responsive to said marking signal for ejecting a given quantity of a distinctive marking liquid onto said item to be marked without contacting said item; and enclosed guide means coupling the point of said marking apparatus at which said liquid is ejected with a container at lowered atmospheric pressure relative to that at said point for drawing off excess liquid which would otherwise form at the ejection point.

* * * * *